(12) United States Patent
Lee

(10) Patent No.: US 10,672,805 B2
(45) Date of Patent: Jun. 2, 2020

(54) METHOD FOR MAKING MICRO LED DISPLAY PANEL AND PIXEL DRIVING CIRCUIT OF SAME

(71) Applicant: Century Micro Display Technology (Shenzhen) Co., Ltd., Shenzhen (CN)

(72) Inventor: Kuo-Sheng Lee, New Taipei (TW)

(73) Assignee: Century Micro Display Technology (Shenzhen) Co., Ltd., Shenzhen (CN)

( * ) Notice: Subject to any disclaimer, the term of this patent is extended or adjusted under 35 U.S.C. 154(b) by 0 days.

(21) Appl. No.: 16/191,474

(22) Filed: Nov. 15, 2018

(65) Prior Publication Data

US 2019/0148415 A1 May 16, 2019

Related U.S. Application Data

(60) Provisional application No. 62/586,756, filed on Nov. 15, 2017.

(51) Int. Cl.
| | | |
|---|---|---|
| *H01L 27/12* | (2006.01) | |
| *H01L 25/13* | (2006.01) | |
| *H01L 25/16* | (2006.01) | |
| *H01L 33/00* | (2010.01) | |
| *H01L 25/075* | (2006.01) | |

(52) U.S. Cl.
CPC ...... *H01L 27/1259* (2013.01); *H01L 25/0753* (2013.01); *H01L 25/13* (2013.01); *H01L 25/167* (2013.01); *H01L 27/1255* (2013.01); *H01L 33/0095* (2013.01)

(58) Field of Classification Search
None
See application file for complete search history.

(56) References Cited

U.S. PATENT DOCUMENTS

| | | | | |
|---|---|---|---|---|
| 10,163,869 | B2 * | 12/2018 | Zou | H01L 21/67781 |
| 10,410,893 | B2 * | 9/2019 | Hsu | H01L 21/67288 |
| 10,424,500 | B2 * | 9/2019 | Chang | H01L 33/62 |
| 2014/0159043 | A1 * | 6/2014 | Sakariya | H01L 27/124 257/59 |
| 2014/0267683 | A1 * | 9/2014 | Bibl | H01L 51/50 348/87 |
| 2017/0062683 | A1 * | 3/2017 | Chen | H01L 33/145 |
| 2017/0142874 | A1 * | 5/2017 | Pourchet | H01L 21/6836 |
| 2017/0179097 | A1 * | 6/2017 | Zhang | H01L 25/167 |

(Continued)

*Primary Examiner* — Shaun M Campbell
(74) *Attorney, Agent, or Firm* — ScienBiziP, P.C.

(57) ABSTRACT

A method for making a micro LED display panel includes: providing a transferring plate and a growth substrate with at least one micro LED; transferring the micro LED from the growth substrate to the transfer plate; providing a TFT substrate including a driving circuit including TFTs; the TFT substrate provided with a conductive connecting element, an insulating layer covering the conductive connecting element, and a contact electrode on a side of the insulating layer; and powering the driving circuit to apply a reference voltage to the contact electrode, and a voltage different from the reference voltage is applied to the conductive connecting element, and making the contact electrode on the TFT substrate contact with the first electrode of the micro LED; the micro LED is detached from the transferring plate onto the TFT substrate; and bonding the conductive connecting element to the micro LED. The making method is simple.

14 Claims, 7 Drawing Sheets

(56) References Cited

U.S. PATENT DOCUMENTS

2017/0215280 A1* 7/2017 Chaji ................... H05K 1/111
2018/0351030 A1* 12/2018 Goward ................ H01L 24/95
2019/0319014 A1* 10/2019 Chang ................ H01L 27/124
2020/0013662 A1* 1/2020 Chaji .................... H01L 33/62

* cited by examiner

METHOD FOR MAKING MICRO LED DISPLAY PANEL AND PIXEL DRIVING CIRCUIT OF SAME

FIELD

The subject matter herein generally relates to a method for making a micro light emitting diode (LED) display panel and a pixel driving circuit of the micro LED display panel.

BACKGROUND

A micro LED display panel includes a thin film transistor (TFT) substrate and a plurality of micro LEDs spaced apart from each other on TFT substrate. A method for making a micro LED display panel generally includes preparing a plurality of micro LEDs on a silicon substrate and transferring the micro LEDs from the silicon substrate onto the thin film transistor substrate. However, since each of the micro LEDs is extremely small in size, no more than 100 micrometers, known methods of making the micro LED display panel requires high precision.

Therefore, there is room for improvement in the art.

BRIEF DESCRIPTION OF THE DRAWINGS

Implementations of the present technology will now be described, by way of embodiments only, with reference to the attached figures.

DETAILED DESCRIPTION

Figure 1A:
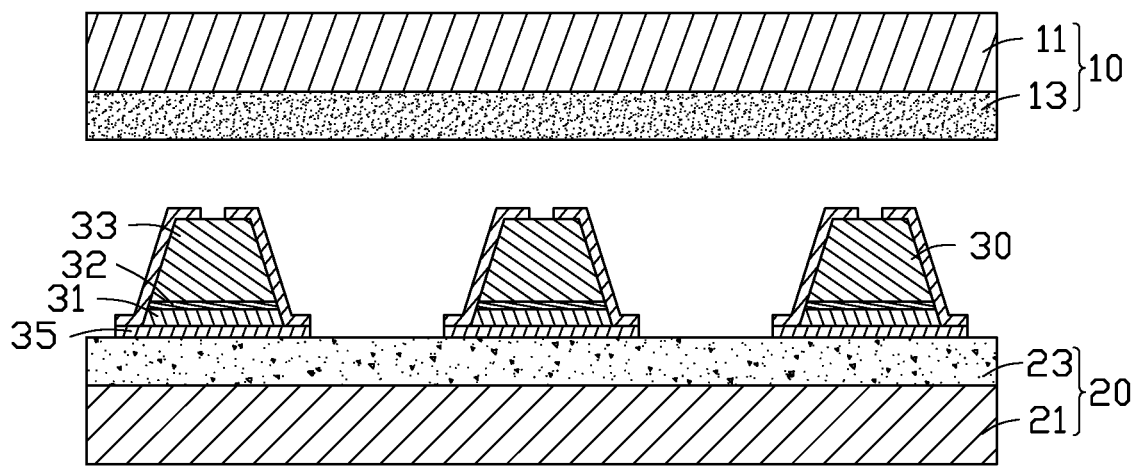
FIG. 1A is a cross-sectional view illustrating a method for making a micro LED display panel according to a first embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "coupled" is defined as coupled, whether directly or indirectly through intervening components, and is not necessarily limited to physical connections. The connection can be such that the objects are permanently coupled or releasably coupled. The term "comprising" when utilized, means "including, but not necessarily limited to"; it specifically indicates open-ended inclusion or membership in the so-described combination, group, series, and the like. The term "micro LED 30" herein refers to an LED having a size of a few millimeters or less (for example, several millimeters, several hundred micrometers, or less than or equal to 100 micrometers).

First Embodiment

The method for making a micro LED display panel according to the first embodiment of the present disclosure is as follows.

Step S1: as shown in FIG. 1A, a transferring plate 10 and a growth substrate 20 are provided. The growth substrate 20 has a plurality of micro LEDs 30.

As shown in FIG. 1A, the transferring plate 10 includes a substrate 11 and an adhesive layer 13 on a surface of the substrate 11. The adhesive layer 13 is configured to attach the micro LEDs 30 to the transferring plate 10. The adhesive layer 13 is made of a material that can decompose and lose its adhesiveness by ultraviolet irradiating or heating. The growth substrate 20 includes a wafer 21 and a sacrificial layer 23 on a surface of the wafer 21. The micro LEDs 30 are bonded to a surface of the sacrificial layer 23 away from the wafer 21. The sacrificial layer 23 is made of a material that can decompose and disengage the micro LEDs 30, by laser irradiating.

As shown in FIG. 1A, each micro LED 30 includes a P-type doped light emitting layer 31, an active layer 32, and an N-type doped light emitting layer 33. The active layer 32 is located between the P-type doped light emitting layer 31 and the N-type doped light emitting layer 33. The P-type doped light emitting layer 31 is relatively close to the sacrificial layer 23, and the N-type doped light emitting layer 33 is relatively far from the sacrificial layer 23. A first electrode 35 is on one end of each micro LED 30 adjacent to the sacrificial layer 23, and the first electrode 35 is between the micro LED 30 and the sacrificial layer 23. In this embodiment, the first electrode 35 is located between the P-type doped light emitting layer 31 and the sacrificial layer 23.

Figure 1B:
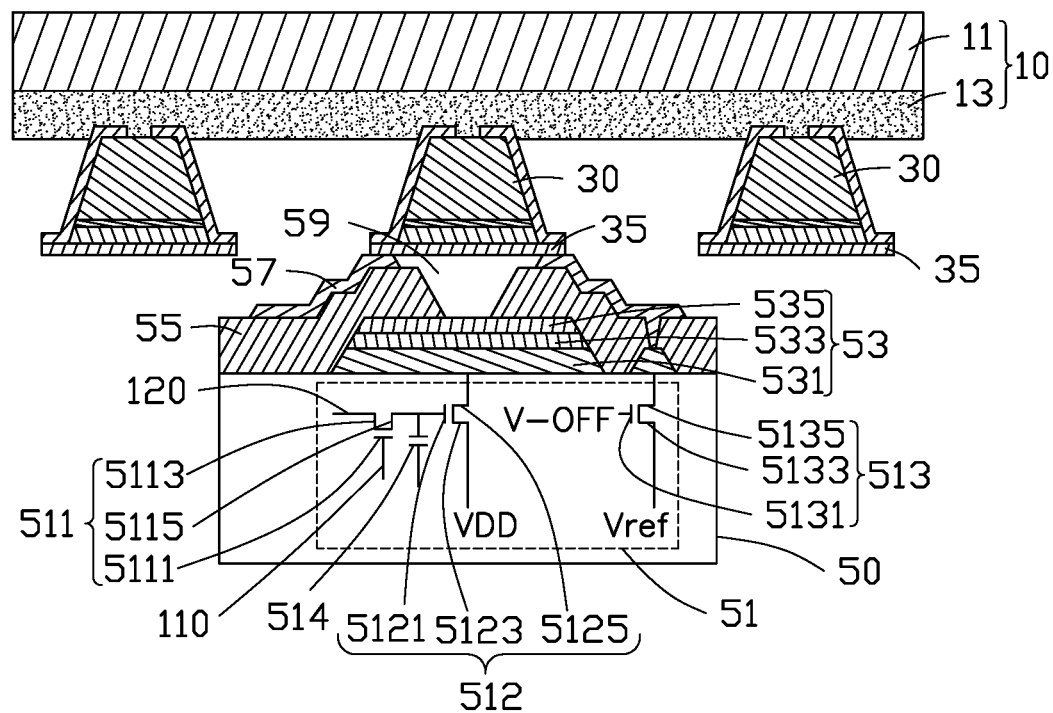
FIG. 1B is a cross-sectional view illustrating a method for making a micro LED display panel according to a first embodiment of the present disclosure.

Step S2: as shown in FIG. 1B, the micro LEDs 30 are transferred from the growth substrate 20 onto the transferring plate 10.

As shown in FIG. 1B, the micro LEDs 30 and the first electrodes 35 are disengaged from the sacrificial layer 23 by laser irradiating the sacrificial layer 23, the micro LEDs 30 and the first electrodes 35 are bonded to the transferring plate 10 only by adhesiveness of the adhesive layer 13.

Step S3: Referring to FIG. 1B, a thin film transistor (TFT) substrate 50 is provided and the micro LEDs 30 are transferred from the transferring plate 10 onto the TFT substrate 50.

Figure 2A:
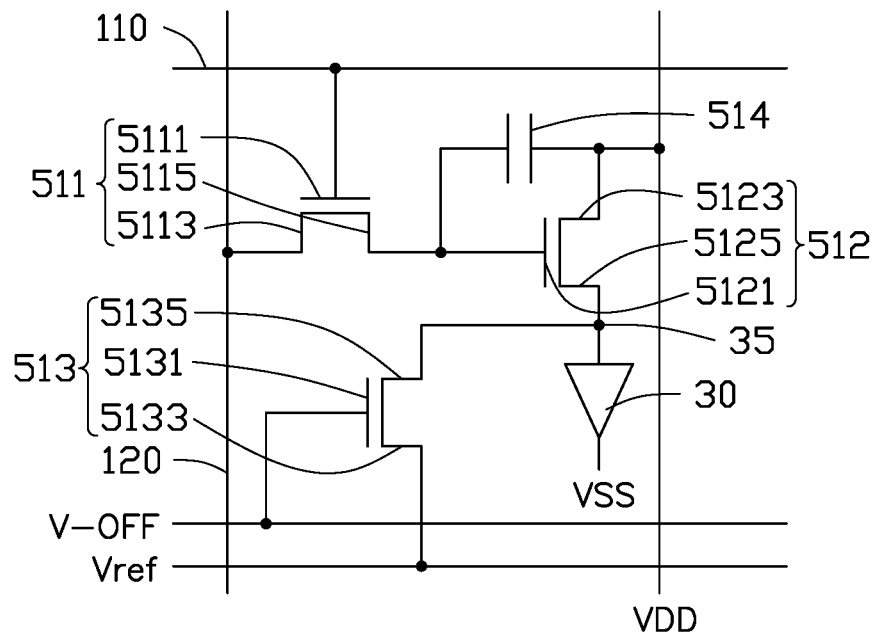
FIG. 2A shows an equivalent circuit diagram of a pixel unit of the micro LED display panel of the first embodiment.
Figure 2B:
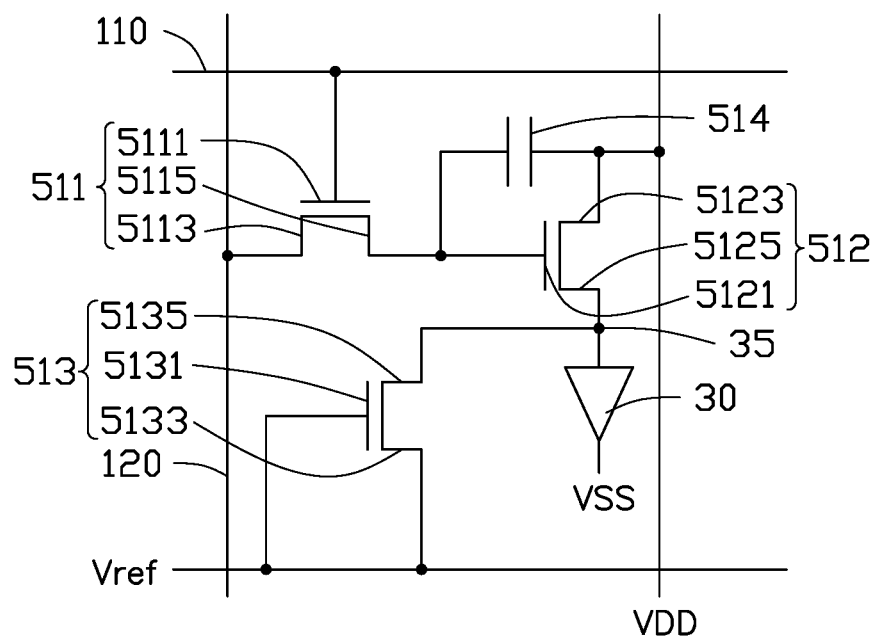
FIG. 2B shows another equivalent circuit diagram of a pixel unit of the micro LED display panel of the first embodiment.

As shown in FIG. 1B, the TFT substrate 50 is a multilayer structure and includes a driving circuit 51 that includes TFTs (such as TFT 511, TFT 512, and TFT 513) and capacitors (such as capacitor 514). The driving circuit 51 also includes scan lines 110 and data lines 120, as shown in FIG. 2A and FIG. 2B. Both FIG. 2A and FIG. 2B only show one scan line 110 and one data line 120. It is known that the micro LED display panel defines a plurality of pixel units (not shown), and each one micro LED 30 corresponds to one pixel unit, each pixel unit is provided with at least one TFT and at least one storage capacitor. In this embodiment, conductive connecting elements 53 are formed on the TFT substrate 50, FIG. 1B shows one conductive connecting element 53. Each conductive connecting element 53 corresponds to one micro LED 30 and is configured to connect the first electrode 35 of the micro LED 30. The conductive connecting element 53 includes a conductive transition layer 533 on the TFT substrate 50. In the present embodiment, the conductive connecting element 53 further includes a base conductive layer 531 on the TFT substrate 50 and a conductive transition layer 533 on a side of the base conductive layer 531 away from the TFT substrate 50. The conductive solder layer 535 is on a side of the conductive transition layer 533 away from the TFT substrate 50. The conductive transition layer 533 is between the base conductive layer 531 and the conductive solder layer 535. As shown in FIG. 1B, an insulating layer 55 is on the TFT substrate 50 and covers the conductive connecting element 53. Contact electrodes 57 are on a side of the insulating layer 55 away from the TFT substrate 50, FIG. 1B shows one contact electrode 57. Each contact electrode 57 corresponds to one conductive connecting element 53. A through hole 59 is defined in the contact electrode 57. The through hole 59 extends through the contact electrode 57 and the insulating layer 55 to expose the conductive connecting element 53, in particular, the conductive solder layer 535 of the conductive connecting element 53 is exposed. The contact electrode 57 also extends through the insulating layer 55 to be electrically coupled to the TFT of the driving circuit 51.

In one embodiment, the base conductive layer 531 may be made of indium tin oxide; the conductive solder layer 535 may be made of tin. The conductive transition layer 533 is configured for preventing the material of the conductive solder layer 535 diffusing into the base conductive layer 531. The conductive transition layer 533 may be made of nickel or gold.

The TFT substrate 50 drives the micro LEDs 30 to emit light by the driving circuit 51. As shown in FIG. 1B, a first TFT 511, a second TFT 512, a third TFT 513, and a storage capacitor 514 are provided in the driving circuit 51 corresponding to each micro LED 30 (each pixel unit). As shown in FIG. 1B, the first TFT 511 includes a gate electrode 5111 electrically coupled to a scan line 110, a source electrode 5113 electrically coupled to a data line 120, and a drain electrode 5115 electrically coupled to a first end of the storage capacitor 514. The second TFT 512 includes a gate electrode 5121 electrically coupled to the drain electrode of the first TFT 514, a source electrode 5123 electrically coupled to a direct current voltage VDD, and a drain electrode 5125 electrically coupled to conductive connecting element 53, particularly to the base conductive layer 531. The third TFT 513 includes a gate electrode 5131 electrically coupled to a control voltage V_OFF, a source electrode 5133 electrically coupled to a reference voltage Vref, and a drain electrode 5135 electrically coupled to the contact electrode 57. The reference voltage Vref is different from the direct current voltage VDD.

As shown in FIG. 1B, during the process of transferring the micro LED 30, the TFT substrate 50, particularly the contact electrode 57, resists against and is in direct contact with the first electrode 35 of the micro LEDs 30 in order to transfer the micro LEDs 30 onto the TFT substrate 50. Each micro LED 30 is aligned with a conductive connecting element 53, and the first electrode 35 of each micro LED 30 resists against one contact electrode 57 so as to be in direct contact with the contact electrode 57. During the transferring process of the micro LED 30, the first TFT 511, the second TFT 512, and the third TFT 513 are powered on while the TFT substrate 50 resists against the micro LEDs 30, thus the reference voltage Vref is applied to both the contact electrode 57 and the first electrode 35. The direct current voltage VDD is applied to the conductive connecting element 53. Since the reference voltage Vref is different from the direct current voltage VDD, the first electrode 35 of the micro LED 30 and the conductive connecting element 53 of the TFT substrate 50 are attracted to each other, that is, the micro LED 30 and the TFT substrate 50 are attracted to each other.

During the process of transferring the micro LED 30, the adhesive layer 13 is irradiated with ultraviolet or heated in order to remove the adhesiveness of the adhesive layer 13 when the first TFT 511, the second TFT 512, and the third TFT 513 are powered on. The micro LED 30 and the first electrode 35 are thus peeled off from the adhesive layer 13 of the transferring plate 10. After the micro LED 30 and the first electrode 35 are separated from the transferring plate 10, since the first electrode 35 of the micro LED 30 and the conductive connecting element 53 of the TFT substrate 50 are attracted to each other, the micro LED 30 is relatively stable on the TFT substrate 50 and will not move on the TFT substrate 50.

When the first electrode 35 of the micro LED 30 resists against the contact electrode 57, the first electrode 35 of the micro LED 30 is not in direct contact with the conductive connecting element 53 due to the through hole 59.

Figure 1C:
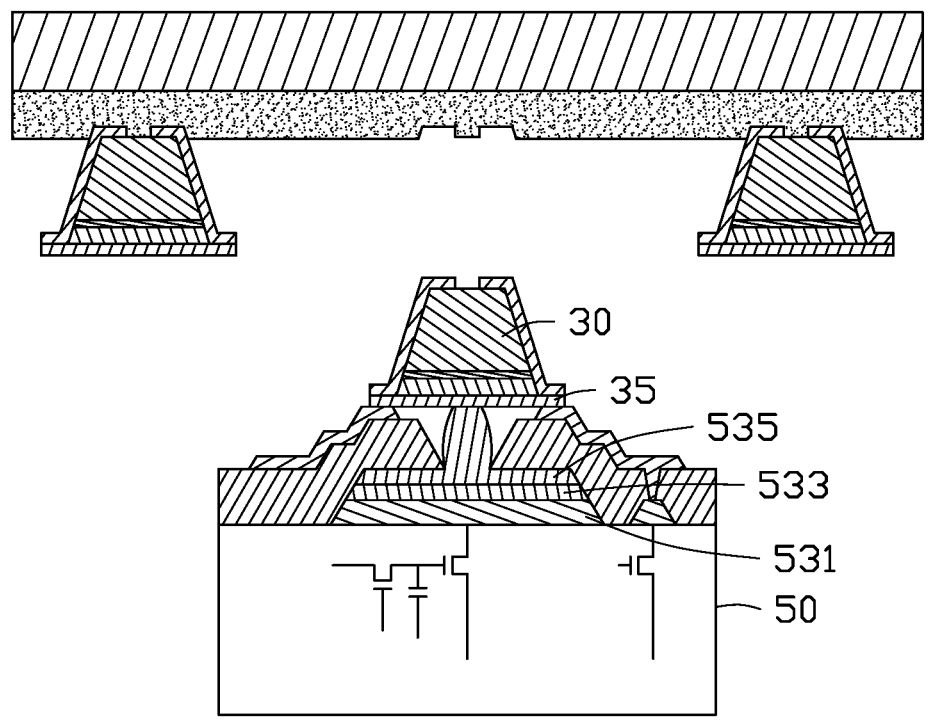
FIG. 1C is a cross-sectional view illustrating a method for making a micro LED display panel according to a first embodiment of the present disclosure.

Step S4: referring to FIG. 1C, the conductive solder layer 535 is heated to melt and bond the first electrode 35 of the micro LED 30. Therefore, the micro LED 30 is permanently fixed to the TFT substrate 50.

The conductive solder layer 535 melts and is in direct contact with the first electrode 35 of the micro LED 30, then the conductive solder layer 535 is solidified to firmly bond the first electrode 35. As such, the micro LED 30 is fixed to the TFT substrate 50.

At this time, since the conductive connecting element 53 is electrically coupled to the first electrode 35, both the drain electrode 5125 of the second TFT 512 and the drain electrode 5135 of the third TFT 513 are electrically coupled to the first electrode 35 of the micro LED 30. In this case, two equivalent circuit diagrams of one pixel unit of the TFT substrate 50 are shown, in FIG. 2A and FIG. 2B respectively.

As shown in FIG. 2A, the gate electrode 5111 of the first TFT 511 is electrically coupled to the scan line 110, the source electrode 5113 of the first TFT 511 is electrically coupled to the data line 120, and the drain electrode 5115 of the first TFT 511 is electrically coupled to the drain electrode of the first TFT 514. The gate electrode 5121 of the second TFT 512 is electrically coupled to the drain electrode 5115 of the first TFT 511, the source electrode 5123 of the second TFT 512 is electrically coupled to the direct current voltage VDD, and the drain electrode 5125 of the second TFT 512 is electrically coupled to the first electrode 35 of the micro LED 30. The gate electrode 5131 of the third TFT 513 is electrically coupled to the control voltage V_OFF, the source electrode 5133 of the third TFT 513 is electrically coupled to the reference voltage Vref, and the drain electrode 5135 of the third TFT 513 is coupled to the first electrode 35 of the micro LED 30. A first end of the storage capacitor 514 is electrically coupled to the drain electrode 5115 of the first TFT 511 and the gate electrode 5121 of the second TFT 512 and a second end of the storage capacitor 514 is electrically coupled to the source electrode 5123 of the second TFT 512.

FIG. 2A shows the third TFT 513 being used only during the process of transferring the micro LED 30 onto the TFT substrate 50. When the micro LED display panel is in use and displaying images, only the first TFT 511 and the second TFT 512 operate, the third TFT 513 will be powered off and the control voltage V_OFF will no longer be applied to the gate electrode 5131 of the third TFT 513. Therefore, the reference voltage Vref will not be applied to the first electrode 35 of the micro LED 30 and the reference voltage Vref will not affect emission of light from the micro LED 30.

As shown in FIG. 2B, the gate electrode 5111 of the first TFT 511 is electrically coupled to the scan line 110, the source electrode 5113 of the first TFT 511 is electrically coupled to the data line 120, and the drain electrode 5115 of the first TFT 511 is electrically coupled to the drain electrode of the first TFT 514. The gate electrode 5121 of the second TFT 512 is electrically coupled to the drain electrode of the first TFT 514, the source electrode 5123 of the second TFT 512 is electrically coupled to the direct current voltage VDD, and the drain electrode 5125 of the second TFT 512 is electrically coupled to the first electrode 35 of the micro LED 30. The gate electrode 5131 of the third TFT 513 is electrically coupled to the drain electrode 5135 of the third TFT 513, the source electrode 5133 of the third TFT 513 is electrically coupled to the reference voltage Vref, and the drain electrode 5135 of the third TFT 513 is coupled to the first electrode 35 of the micro LED 30. A first end of the storage capacitor 514 is electrically coupled to the drain electrode 5115 of the first TFT 511 and the gate electrode 5121 of the second TFT 512; and a second end of the storage capacitor 514 is electrically coupled to the source electrode 5123 of the second TFT 512.

As shown in FIG. 2B, the third TFT 513 is used not only during the transferring process of the micro LED 30 onto the TFT substrate 50 but also during the display time of the micro LED display panel. When the micro LED display panel is in use and displaying images, the first TFT 511, the second TFT 512, and the third TFT 513 operate. As the reference voltage Vref is less than the direct current voltage VDD, the reference voltage Vref will not be applied to the first electrode 35 of the micro LED 30 and the reference voltage Vref does not affect light emission of the micro LED 30.

The making method may further include a step of forming an insulating layer (not shown) on the TFT substrate 50 to embed the micro LEDs 30 in the insulating layer and a step of forming a second electrode (not shown) on a side of the micro LED 30 away from the TFT substrate 50.

For FIG. 2A and FIG. 2B, the direct current voltage VDD applied to the first electrode 35 of the micro LED 30 is greater than the voltage VSS applied to the second electrode of the micro LED 30. The first electrode 35 is generally referred to as an anode of the micro LED 30, and the second electrode is generally referred to as a cathode of the micro LED 30.

For the equivalent circuit in FIG. 2A, the reference voltage Vref may also be applied to the gate electrode 5131 of the third TFT 513 during the display period, and the reference voltage Vref is less than the voltage VSS of the second electrode (cathode) of the micro LED 30. The third TFT 513 can be used as a reset circuit to improve any stalled image problem, of the display image being "stuck."

The making method of the micro LED display panel utilizes the driving circuit in the TFT substrate to absorb the micro LEDs in the transferring process of the micro LED. Thus, there is no need to provide additional conductive layer for absorbing the micro LED, thereby simplifying the making method and improve the making efficiency.

Second Embodiment

The method for making the micro LED display panel in the second embodiment is substantially the same as the method of first embodiment and includes all the same steps as described above in the first embodiment.

Figure 3:
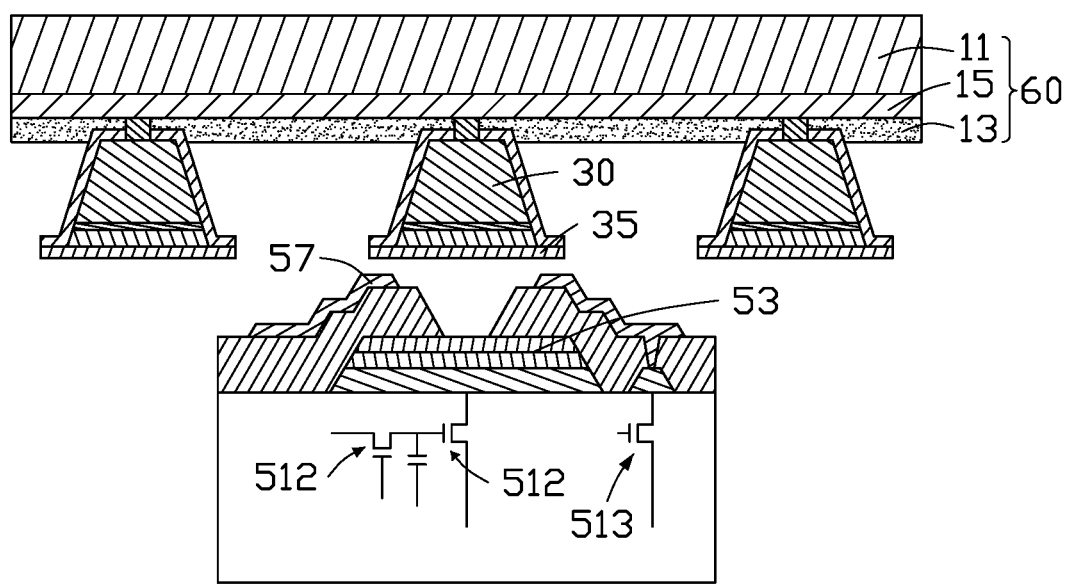
FIG. 3 is a cross-sectional view illustrating a method for making a micro LED display panel according to a second embodiment of the present disclosure.

The different between the method of the present embodiment and the method of the first embodiment is that the transferring plate 60 used in the present embodiment as shown in FIG. 3 of the present embodiment is different from the transferring plate 10 of the first embodiment.

As shown in FIG. 3, the transferring plate 60 of the present embodiment includes not only a substrate 11 and an adhesive layer 13, but also an intermediate conductive layer 15 between the substrate 11 and the adhesive layer 13.

During the transferring process of the micro LED 30, if the first electrode 35 of the micro LED 30 is not in direct contact with one contact electrode 57, the mutual attraction between the first electrode 35 of the micro LED 30 and the conductive connecting element 53 of the TFT substrate 50 does not occur, thus transferring of the micro LEDs 30 may fail.

In the present embodiment, when the micro LED 30 is transferred from the transfer plate 10 to the TFT substrate 50, not only are the first TFT 511, the second TFT 512, and the third TFT 513 powered on, but voltage is also applied to the intermediate conductive layer 15, the voltage being equivalent to the reference voltage Vref. Therefore, even if the first electrode 35 of the micro LED 30 and the conductive connecting element 53 of the TFT substrate 50 do not attract each other, the intermediate conductive layer 15 will attract the conductive connecting element 53 of the TFT substrate 50 to the first electrode of the micro LED 30. Thus the contact electrode 57 resists against and is in direct contact with the corresponding contact electrode 57, thereby causing the first electrode 35 of the micro LED 30 and the conductive connecting element 53 of the TFT substrate 50 to attract each other. Since the intermediate conductive layer 15 in the transferring plate 10 and the contact electrode 57 are given the same reference voltage Vref, the contact electrode 57 only attracts the one micro LED 30 without attracting other micro LEDs 30.

Third Embodiment

The third embodiment is substantially the same as the method of first embodiment and includes all the same steps as described in the first embodiment.

The different between the method of the present embodiment and the method of the first embodiment is that the micro LED 80 of the present embodiment is different from the micro LED 30 of the first embodiment.

Figure 4:
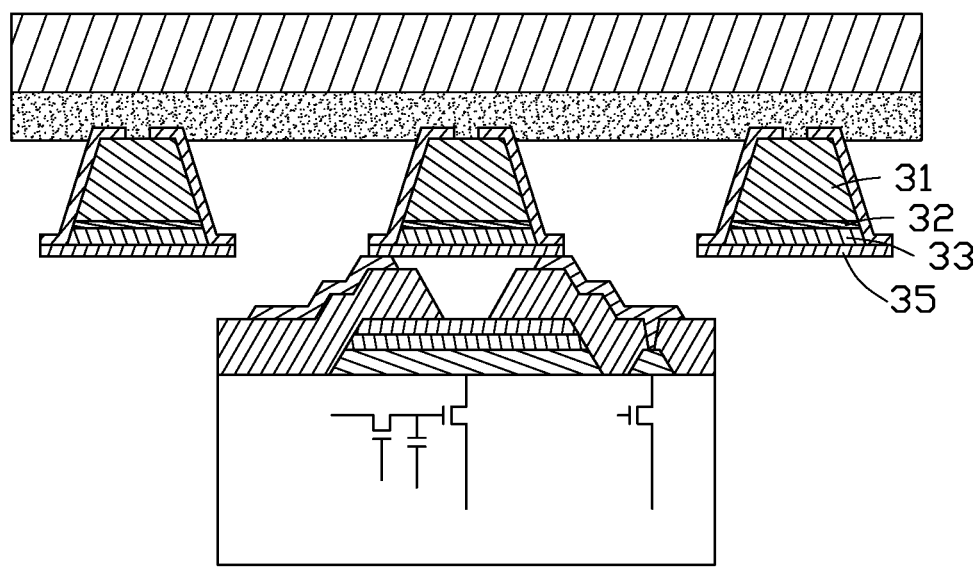
FIG. 4 is a cross-sectional view illustrating a method for making a micro LED display panel according to a third embodiment of the present disclosure.

In the present embodiment, as shown in FIG. 4, each micro LED 80 also includes a P-type doped light emitting layer 31, an active layer 32, and a N-type light emitting layer 33. The stacking order of the P-type doped light emitting layer 31, the active layer 32, and the N-type light emitting layer 33 in each micro LED 80 is different from that in each micro LED 30 of the first embodiment. In the present embodiment, the N-type doped light emitting layer 33 is relatively close to the first electrode 35, and the P-type doped light emitting layer 31 is relatively far from the first electrode 35. In the first embodiment, the P-type doped light emitting layer 31 is relatively close to the first electrode 35, and the N-type doped light emitting layer 33 is relatively far from the first electrode 35.

Figure 5A:
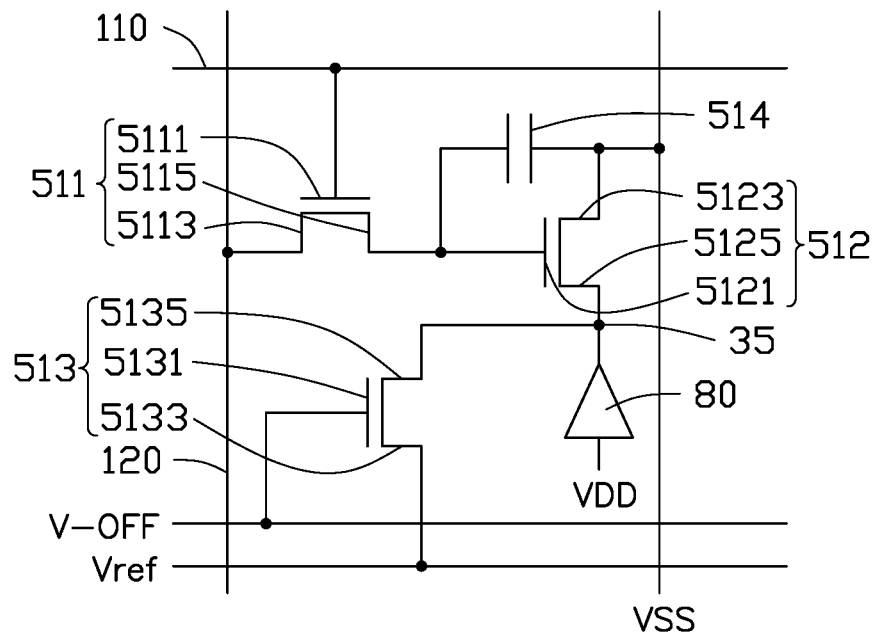
FIG. 5A shows an equivalent circuit diagram of a pixel unit of the micro LED display panel of the third embodiment.
Figure 5B:
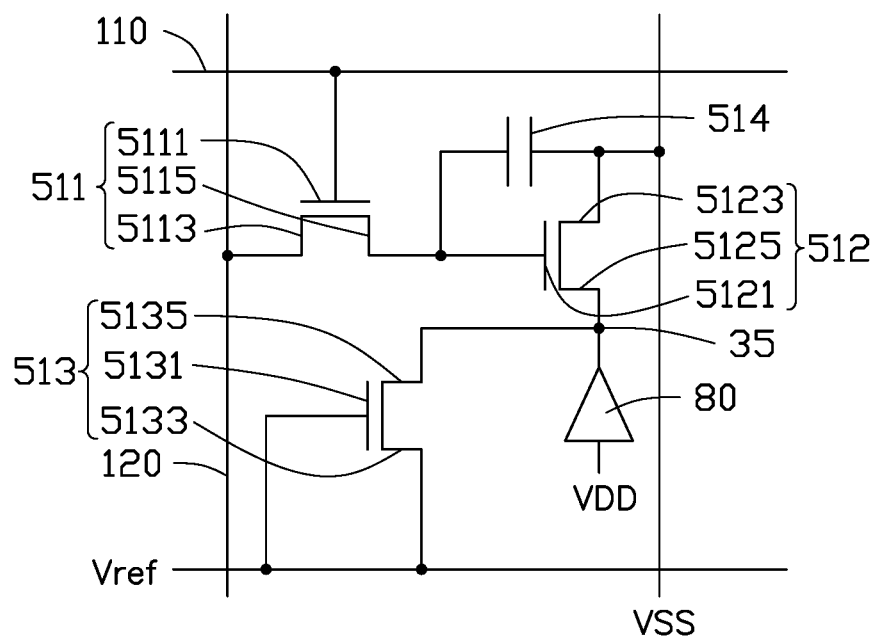
FIG. 5B shows another equivalent circuit diagram of a pixel unit of the micro LED display panel of the third embodiment.

Two equivalent circuit diagrams of one pixel unit of the TFT substrate 50 used in the third embodiment are shown in FIG. 5A and FIG. 5B, respectively.

As shown in FIG. 5A, the gate electrode 5111 of the first TFT 511 is electrically coupled to a scan line 110, the source electrode 5113 of the first TFT 511 is electrically coupled to a data line 120, and the drain electrode 5115 of the first TFT 511 is electrically coupled to the drain electrode of the first TFT 514. The gate electrode 5121 of the second TFT 512 is electrically coupled to the drain electrode of the first TFT 514, the source electrode 5123 of the second TFT 512 is electrically coupled to the voltage VSS, and the drain electrode 5125 of the second TFT 512 is electrically coupled to the first electrode 35 of the micro LED 30. The gate electrode 5131 of the third TFT 513 is electrically coupled to a control voltage V_OFF, the source electrode 5133 of the third TFT 513 is electrically coupled to a reference voltage Vref, and the drain electrode 5135 of the third TFT 513 is coupled to the first electrode 35 of the micro LED 30. A first end of the storage capacitor 514 is electrically coupled to the drain electrode 5115 of the first TFT 511 and the gate electrode 5121 of the second TFT 512, and a second end of the storage capacitor 514 is electrically coupled to the source electrode 5123 of the second TFT 512.

As FIG. 5A shows, the third TFT 513 is used only during the process of transferring the micro LED 80 onto the TFT substrate 50. When the micro LED display panel is displaying images, only the first TFT 511 and the second TFT 512 operate, the third TFT 513 will be powered off and the control voltage V_OFF will no longer be applied to the gate electrode 5131 of the third TFT 513. Therefore, the reference voltage Vref will not be applied to the first electrode 35 of the micro LED 80 and the reference voltage Vref will not affect the light emitting of the micro LED 80.

For the equivalent circuit in FIG. 5A, the reference voltage Vref may also be applied to the gate electrode 5131 of the third TFT 513 during the display period, and the reference voltage Vref is less than the voltage VSS of the second electrode (cathode) of the micro LED 30, the third TFT 513 can be used as a reset circuit to reset any stalled images.

As shown in FIG. 5B, the gate electrode 5111 of the first TFT 511 is electrically coupled to the scan line 110, the source electrode 5113 of the first TFT 511 is electrically coupled to the data line 120, and the drain electrode 5115 of the first TFT 511 is electrically coupled to the drain electrode of the first TFT 514. The gate electrode 5121 of the second TFT 512 is electrically coupled to the drain electrode of the first TFT 514, the source electrode 5123 of the second TFT 512 is electrically coupled to the voltage VSS, and the drain electrode 5125 of the second TFT 512 is electrically coupled to the first electrode 35 of the micro LED 30. The gate electrode 5131 of the third TFT 513 is electrically coupled to a reference voltage Vref, the source electrode 5133 of the third TFT 513 is electrically coupled to the reference voltage Vref, and the drain electrode 5135 of the third TFT 513 is coupled to the first electrode 35 of the micro LED 30. A first end of the storage capacitor 514 is electrically coupled to the drain electrode 5115 of the first TFT 511 and the gate electrode 5121 of the second TFT 512, and the second end of the storage capacitor 514 is electrically coupled to the source electrode 5123 of the second TFT 512.

As FIG. 5B shows, the third TFT 513 is used not only during the transferring process of the micro LED 80 onto the TFT substrate 50 but also during the display time of the micro LED display panel. When the micro LED display panel is displaying images, the first TFT 511, the second TFT 512, and the third TFT 513 operate. As the reference voltage Vref is less than the voltage VSS, the reference voltage Vref will not be applied to the first electrode 35 of the micro LED 80 and the reference voltage Vref will not affect the light emitting of the micro LED 80.

Referring to FIG. 5A and FIG. 5B, the voltage VSS applied to the first electrode 35 of the micro LED 30 is less than the voltage VDD applied to the second electrode of the micro LED 30. The first electrode 35 is generally referred to as a cathode of the micro LED 30, and the second electrode is generally referred to as an anode of the micro LED 30.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A method for making a micro light emitting diode (LED) display panel, comprising:

providing a transferring plate and a growth substrate comprising at least one micro LED, the transferring plate comprising a substrate and an adhesive layer on a surface of the substrate, a first electrode being between each micro LED and the growth substrate;

transferring the micro LED and the first electrode from the growth substrate onto the transferring plate;

providing a thin film transistor (TFT) substrate, the TFT substrate comprising a driving circuit, the driving circuit comprising a plurality of scan lines, a plurality of data lines, and a plurality of TFTs; wherein a conductive connecting element is formed on the TFT substrate and electrically coupled to the driving circuit; an insulating layer is on the TFT substrate and covers the conductive connecting element; a contact electrode is on a side of the insulating layer away from the TFT substrate; wherein a through hole is defined in the contact electrode and extends through the contact electrode and the insulating layer to expose the conductive connecting element; the contact electrode extends through the insulating layer to be electrically coupled to the driving circuit; and powering on the driving circuit to apply a reference voltage to the contact electrode by the driving circuit and apply a direct current voltage that is different from the reference voltage to the conductive connecting element;

making the contact electrode on the TFT substrate to resist against the first electrode and the contact electrode electrically coupled to the first electrode;

treating the adhesive layer to lose adhesiveness and keeping the driving circuit powering on to transfer the micro LED and the first electrode from the transferring plate to the TFT substrate; and treating the conductive connecting element to bond the first electrode.

2. The method of claim 1, wherein the adhesive layer decomposes and loses adhesiveness by ultraviolet irradiating or heating.

3. The method of claim 1, wherein treating the adhesive layer is carried out by ultraviolet irradiating or heating the adhesive layer.

4. The method of claim 1, wherein the growth substrate comprises a wafer and a sacrificial layer on a surface of the wafer; the first electrode of the micro LED is bonded to a surface of the sacrificial layer away from the wafer.

5. The method of claim 4, wherein the sacrificial layer decomposes and disengages from the micro LED under laser irradiation.

6. The method of claim 5, wherein transferring the micro LED and the first electrode from the growth substrate is carried out by irradiating the sacrificial layer.

7. The method of claim 1, wherein the conductive connecting element comprises a conductive solder layer on the TFT substrate.

8. The method of claim 7, wherein the conductive connecting element further comprises a base conductive layer on the TFT substrate, a conductive transition layer on a side of the base conductive layer away from the TFT substrate; the conductive transition layer is between the base conductive layer and the conductive solder layer; the conductive transition layer prevents the conductive solder layer from diffusing into the base conductive layer.

9. The method of claim 7, wherein treating the conductive connecting element is carried out by melting the conductive connecting element.

10. The method of claim 1, wherein the driving circuit comprises a first TFT, a second TFT, a third TFT, and a storage capacitor corresponding to each of the micro LED, wherein:

the first TFT comprises a gate electrode electrically coupled to one of the plurality of scan lines, a source electrode electrically coupled to one of the plurality of data lines, and a drain electrode electrically coupled to a first end of the storage capacitor;

the second TFT comprises a gate electrode electrically coupled to the drain electrode of the first TFT, a source electrode electrically coupled to the direct current voltage, and a drain electrode electrically coupled to the conductive connecting element;

the third TFT comprises a gate electrode electrically coupled to a control voltage, a source electrode electrically coupled to the reference voltage, and a drain electrode electrically coupled to the contact electrode; and the drain electrode of the first TFT is electrically coupled to the drain electrode of the first TFT and the gate electrode of the second TFT, and a second end of the storage capacitor is electrically coupled to the direct current voltage.

11. The method of claim 1, wherein the driving circuit comprises a first TFT, a second TFT, a third TFT, and a storage capacitor corresponding to each micro LED; wherein:

the first TFT comprises a gate electrode electrically coupled to one of the plurality of scan lines, a source electrode electrically coupled to one of the plurality of data lines, and a drain electrode electrically coupled to a first end of the storage capacitor;

the second TFT comprises a gate electrode electrically coupled to the drain electrode of the first TFT, a source electrode electrically coupled to the direct current voltage, and a drain electrode electrically coupled to the conductive connecting element;

the third TFT comprises a gate electrode and a drain electrode electrically coupled together, a source electrode electrically coupled to the reference voltage; the drain electrode electrically coupled to the contact electrode; and a first end of the storage capacitor is electrically coupled to the drain electrode of the first TFT and the gate electrode of the second TFT, and a second end of the storage capacitor is electrically coupled to the source electrode of the second TFT.

12. The method of claim 1, wherein the reference voltage is less than the direct current voltage.

13. The method of claim 1, wherein the transferring plate further comprises an intermediate conductive layer between the substrate and the adhesive layer.

14. The method of claim 13, wherein the intermediate conductive layer is applied with a voltage equal to the reference voltage during transferring the micro LED and the first electrode from the transferring plate to the TFT substrate.

* * * * *